United States Patent [19]

Hu et al.

[11] Patent Number: 5,739,064

[45] Date of Patent: Apr. 14, 1998

[54] SECOND IMPLANTED MATRIX FOR AGGLOMERATION CONTROL AND THERMAL STABILITY

[75] Inventors: Yong-Jun Hu; Pai-Hung Pan; Mark Klare, all of Boise, Id.

[73] Assignee: Micron Technology, Inc., Boise, Id.

[21] Appl. No.: 764,685

[22] Filed: Nov. 27, 1996

[51] Int. Cl.$^6$ .................................. H01L 21/425
[52] U.S. Cl. ..................... 438/528; 438/532; 438/533; 438/659
[58] Field of Search ..................... 438/528, 532, 438/533, 158, 206, 162, 659

[56] References Cited

U.S. PATENT DOCUMENTS 4,682,407  7/1987  Wilson ........................ 438/517
5,633,177  5/1997  Anjum ........................ 438/301

*Primary Examiner*—Brian Dutton
*Assistant Examiner*—Brendan Mee
*Attorney, Agent, or Firm*—Workman, Nydegger & Seeley

[57] ABSTRACT

A semiconductor device on a semiconductor wafer, wherein improvements are realized to agglomeration control, resistivity, and thermal stability of a titanium disilicide layer on a polysilicon layer. Agglomeration control is achieved through the use of two carefully selected low dose barrier diffusion matrix implants into the polysilicon layer, one of which is situated at an interface between the layer of polysilicon and the resultant layer of titanium disilicide film after heat treatment, and the other of which is near the surface of the resultant layer of titanium disilicide film after heat treatment.

36 Claims, 1 Drawing Sheet

SECOND IMPLANTED MATRIX FOR AGGLOMERATION CONTROL AND THERMAL STABILITY

BACKGROUND OF THE INVENTION

1. The Field of the Invention

The present invention relates the manufacture of semiconductor devices. More particularly, the present invention relates to a semiconductor wafer having semiconductor devices thereon, the semiconductor wafer having a substrate subjected to a series of processing steps for forming silicide films on monocrystalline amorphous, or polycrystalline silicon, the processing steps serving to reduce interfacial failures on the wafer due to agglomeration within the silicide films during high temperature anneal processing steps.

2. The Relevant Technology

As is well known in the art, polycrystalline silicon (polysilicon) is a preferred material for gate electrodes in MOSFET structures. Polysilicon is advantageous over metal gate electrodes because it can withstand much higher subsequent processing temperatures before eutectic temperatures are reached. Polysilicon can be deposited on bulk silicon or $SiO_2$ using low pressure chemical vapor deposition (LPCVD).

As the drive toward integrating more active devices on a single integrated circuit necessitates the fabrication of increasingly smaller MOSFET structures, the resistance of the MOSFET gate becomes a limiting factor in device speed. As such, it is beneficial to use materials with the lowest possible sheet resistivities for making contact with the polysilicon gate structure. To this end it is well known that refractory metal silicides can be readily formed on polysilicon MOSFET gate structures using conventional semiconductor deposition and annealing techniques. The refractory metal silicides have low sheet resistivities after annealing and also form low resistance ohmic contacts with commonly used interconnect metals. The resistance of the silicide/polysilicon structures and their overall integrity are greatly affected by the manner in which the structures are processed.

Titanium silicide ($TiSi_2$) has a low sheet resistivity when it has been annealed to a C54 phase. To obtain the desired low resistivities requires high temperature annealing in the range of 700°–1100° C. Numerous techniques for creating and annealing $TiSi_2$ films on MOSFET gate source and drain electrodes are known, and for obtaining the desired low sheet resistivities. The most common of these techniques involves depositing either pure titanium metal, or co-depositing titanium silicide ($TiSi_2$), with subsequent annealing steps to convert the deposited layer to $TiSi_2$ in a C54 phase.

The use of $TiSi_2$ in silicon gate MOSFET fabrication is becoming limited by insufficient process stability at the desired processing temperatures. This instability creates a problem as the trend toward more complex integrated circuits necessitates an increasing number of high temperature processing steps after the deposition and formation of the silicide layer. An unwanted side effect of the high temperature instability of $TiSi_2$ is caused by agglomeration, which is known to occur during high temperature polysilicon processing. Agglomeration is a build-up of re-crystallized silicon, metal, or dopant grains at either or both of the interfaces of the polysilicon layer, and typically occurs during high-temperature annealing. Although the mechanisms of agglomeration are complex and varied, it is widely accepted that a major contributing factor to agglomeration is the action of polysilicon grain boundaries as rapid diffusion routes for transporting silicon and/or dopant ions which diffuse out from the polysilicon during annealing. Silicon which out-diffuses from the polysilicon layer and then recrystallizes at the $TiSi_2$-polysilicon interface can cause severe discontinuities and voids within the $TiSi_2$ layer, resulting in higher sheet resistivity of the silicide with greater variation in resistivity and a greater number of defects.

As it is known in the art that high-temperature annealing is required to achieve the minimum possible room-temperature resistivity of any given silicide, it is clear that advances are needed which will better control the mechanical and electrical stability of refractory metal silicide films (e.g. $TiSi_2$) during high-temperature silicide formation and annealing. Accordingly, it would be an advance in the art to avoid agglomeration, develop superior sheet resistivity and device speed, and increase thermal stability characteristics in refractory metal silicide films.

SUMMARY OF THE INVENTION

Processing steps that overcome the above-mentioned side effects of high-temperature annealing are part of a semiconductor fabrication method of the present invention. A silicon layer, either monocrystalline silicon, amorphous silicon or polysilicon, is deposited on a silicon substrate. A first diffusion barrier matrix is implanted at a specific depth within the silicon layer. A second diffusion barrier matrix is implanted at the surface of the silicon layer. A layer of refractory metal is sputtered on the silicon layer and then a first salicidation anneal is performed at high a temperature. The refractory metal that does not form metal silicide is selectively etched and a second salicidation anneal is performed at a high temperature.

As will be shown in the sections that follow, by proper selection of the elements, concentrations, and implant depths of the above mentioned diffusion barrier matrices, refractory metal silicide, polycide, and salicide structures can be created. The first diffusion barrier matrix is implanted at a depth within the polysilicon layer where the interface between the refractory metal silicide and the polysilicon will be. This has the effect that the refractory metal silicide layer will not break down at the interface of the polysilicon layer into silicon and the refractory metal. The implanting of the second diffusion barrier matrix at the surface of the polysilicon layer controls salicidation to produce a smooth refractory metal silicide film on the surface. As result of this method the structure has superior resistivity and thermal stability characteristics.

These and other aspects of the invention will become apparent to those skilled in the art after referring to the following description and examples.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Additional advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

An invention of processing steps is disclosed which significantly reduce the resistivity and increase thermal stability of annealed refractory metal silicide films. The processing steps reduce agglomeration at the interface of the refractory metal silicide film and an underlying layer of polysilicon or silicon.

The processing steps are useful as part of a general method for fabrication of MOSFET structures, a preferred embodiment of which is disclosed below. In the following description, numerous details are set forth, such as specific materials, process parameters, etc., in order to provide a thorough understanding of the present invention. It will be obvious to one skilled in the art, however, that these specific details need not be employed precisely as described to practice the present invention. In other instances, well-known processing steps are not described in detail so as not to detract from the various details of the embodiments of the invention.

Figure 1:
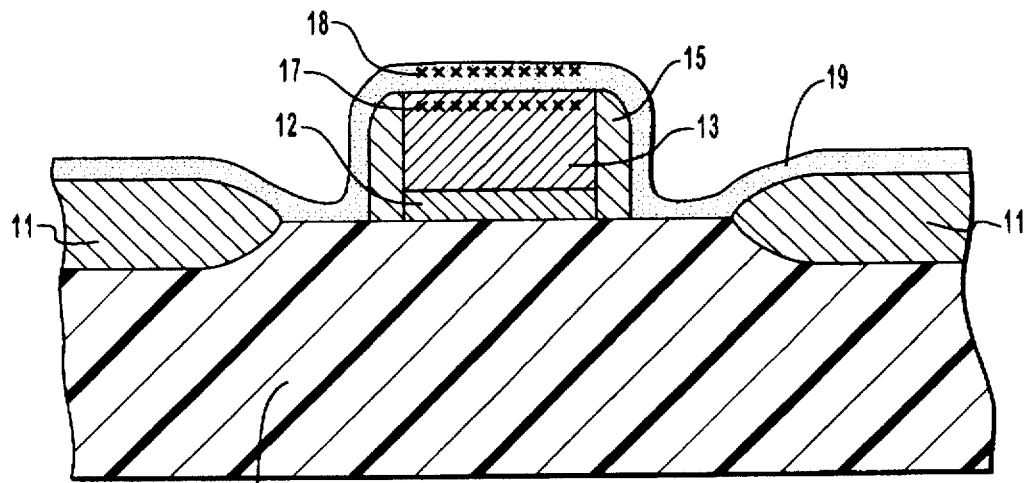
FIGS. 1–3 are simplified cross sectional schematics showing an example of the developments of a MOSFET gate structure as pertains to this invention.

In an embodiment of the present invention, referring to FIG. 1, a thermally grown field oxide film 11 is formed on a P-type or N-type silicon substrate 10 with exposed active areas corresponding to the geometries of the MOSFET structures that are to be fabricated. After cleaning, an insulating film 12, typically $SiO_2$, is grown on the entire exposed surface of the substrate. A polysilicon layer 13 is then deposited over the insulating film, preferably using LPCVD. Other methods for depositing polysilicon layer include PECVD (pressure enhanced chemical vapor deposition), APCVD (atmospheric pressure chemical vapor deposition), and sputtering. Polysilicon layer 13 is formed according to one of the foregoing processes at a temperature preferably in a range from about 50° C. to about 900° C.

Figure 2:
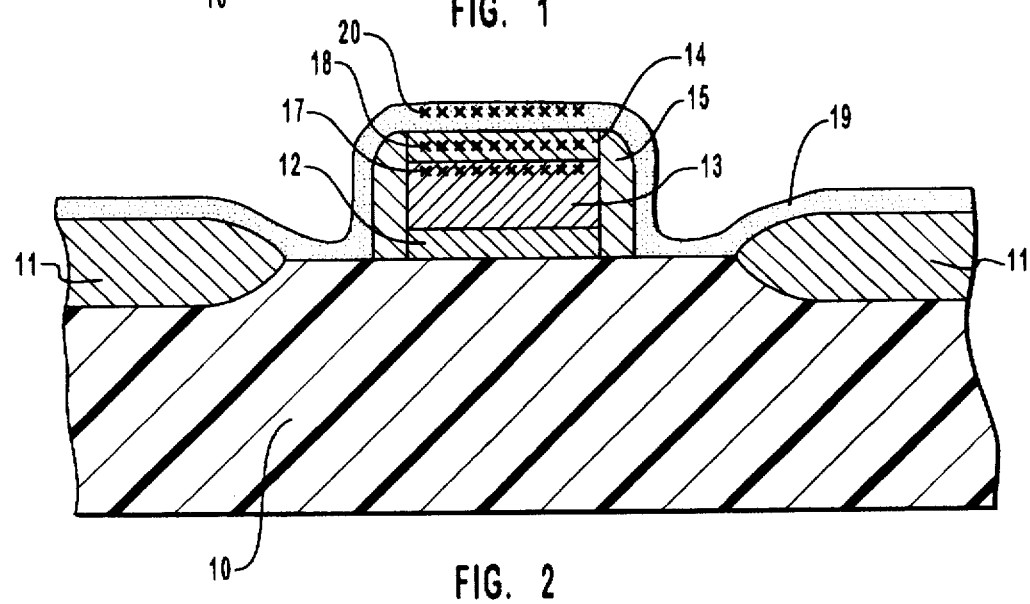

Referring to FIG. 2, a first diffusion barrier matrix 17 is then implanted within polysilicon layer 13 with nitrogen. First diffusion barrier matrix 17 is implanted at a predetermined depth range corresponding to where the interface will be situated between polysilicon layer 13 and a layer of titanium silicide to be formed after a subsequent annealing step. In the preferred embodiment, first diffusion barrier matrix 17 is a $2 \times 10^{13}$ $cm^{-2}$ $_{14}N^+$ implant dose at an energy of about 22 KeV, although other dopants such as phosphorus, or metals such as molybdenum, tungsten, or cobalt could also be used. Other dopant concentrations could also be used but a low dose close to the value stated herein is preferable. First diffusion barrier matrix 17 is used to limit the diffusion of silicon along columnar grain boundaries which form in the polysilicon layer during annealing. Ion implantation is conducted by providing an ion source from which the implanted ions are generated. The ion source may be, for example, phosphorus, nitrogen, or other materials contemplated by the invention.

The wafer is then patterned and insulating film 12 and polysilicon layer 13 are etched to form a polysilicon gate structure consisting of a gate oxide layer 12 and a polysilicon gate layer 13. Insulating side wall spacers 15 are then formed by conventional processing.

A second matrix 18 is then implanted in the surface. Second matrix 18 may comprise, for example, nitrogen ions. Alternatively, other materials, such as phosphorus ions, molybdenum ions, tungsten ions, or cobalt ions may be used in second matrix 18. The primary function of this step is to control salicidation and for silicide surface smoothing on the surface. The first and second implanted matrixes assist a smooth silicide/polysilicon interface and a smooth silicide surface, respectively.

A metallization layer 19 of Ti material is next deposited on polysilicon layer 13 using a standard PVD process. The PVD process is conducted in a temperature range of between 100° C. and 300° C. Alternatively, metallization layer 19 may also be a refractory metal material that is next deposited on polysilicon gate layer 13 preferably using a standard PVD process. Refractory metal materials according to the present invention include at least titanium, tungsten, cobalt, and molybdenum and combinations thereof.

The structure is then subjected to a salicidation anneal. A first salicidation anneal is performed in nitrogen at 750° C. for 20 seconds. A conventional blanket etch is then performed to remove all unreacted titanium metal from the top layer that did not form polycide or salicide structures. A second salicidation anneal is then performed in nitrogen at 825° C. for 10 seconds to fully convert all of the remaining silicide structures to the C54 phase. Alternatively, the anneals may be conducted according to other process parameters. For example, an anneal may include rapid thermal processing at about 1,000° C. for about 20 seconds.

Figure 3:
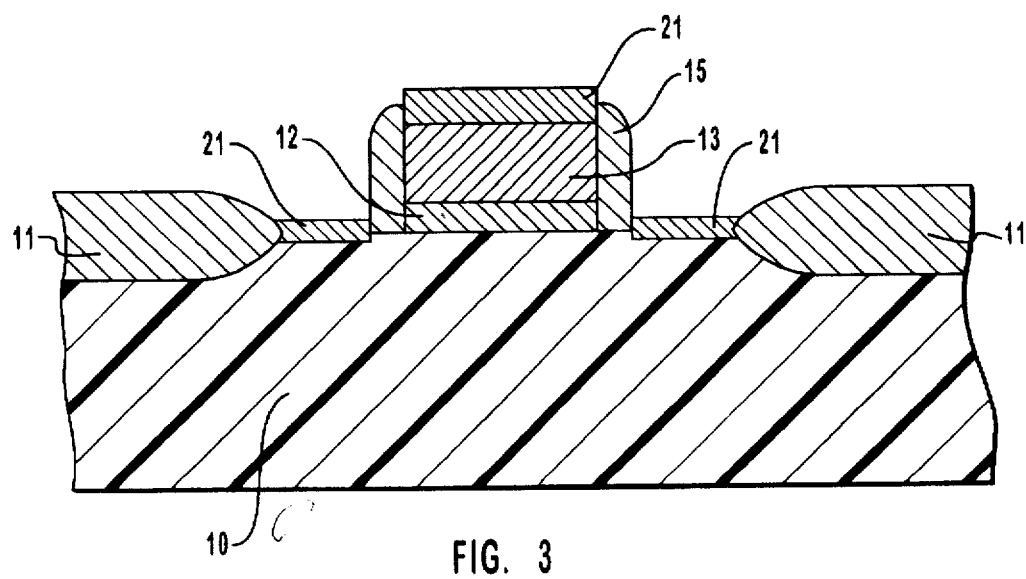

The overall finished MOSFET gate structure appears as shown in FIG. 3. Metallization layer 19 of FIG. 2 has combined with polysilicon gate layer 13 to form a polycide gate layer 21, on top of unreacted silicon. The gate structure includes active regions that form source and drain regions. Results of the foregoing steps reveal a smooth film surface and a smooth interface as demonstrated by resistivity tests. In a preferred embodiment of the present invention, field oxide film 11 has a thickness in a range from about 1,000 Å to about 3,000 Å, insulating film 12 has a thickness in a range from about 50 Å to about 150 Å, polysilicon layer 13 has a thickness in a range from about 1,000 Å to about 2,000 Å, and refractory metal silicide layer 21 has a thickness in a range from about 500 Å to about 2,000 Å. In a preferred embodiment, first diffusion barrier matrix 17 is implanted in polysilicon layer 13 at a predetermined depth in a range from about 200 Å to about 1,000 Å.

EXAMPLES

The following examples are provided for illustration purposes and are not intended to be restrictive of the scope and spirit of the present invention. Table A illustrates a series of tests in which one or more ion dopant implantations were made previous to forming into a structure of a layer of $TiSi_2$ above and on a layer of polysilicon, the layer of polysilicon being above and on a gate oxide that is in turn above and on a P-type silicon substrate. In the Test Nos. 1–3, second and first implant matrices were implanted, respectively, into the polysilicon layer at the surface and the eventual $TiSi_2$- polysilicon interface. Table A illustrates that Tests Nos. 1–3 demonstrate a controlled low-level resistivity. A series of comparative examples (Tests Nos. C1–C7) illustrate that single implant at the surface of the polysilicon, while controlling salicidations of $TiSi_2$, do not achieve the desired low resistivity.

TABLE A

| Test No. | $TiS_{ix}$ depth, angstroms | 1st implant | 2nd implant | Rs after RTP anneal, ohms/square | | | |
|---|---|---|---|---|---|---|---|
| | | | | 0 | 1 | 2 | 3 |
| 1 | 700 | $N^{4,9}$ | $N^{6,9}$ | 2.41 | 2.93 | 3.90 | 5.49 |
| 2 | 650 | $N^{4,9}$ | $N^{6,9}$ | 1.90 | 2.22 | 3.18 | 4.96 |
| 3 | 700 | $N^{4,9}$ | $P^{1,9}$ | 2.36 | 2.83 | 3.68 | 5.15 |
| C1 | 700 | $W^{2,7}$ | | 2.34 | 4.89 | 7.29 | 10.39 |
| C2 | 700 | $Co^{6,7}$ | | 2.55 | 4.06 | 5.72 | 8.06 |
| C3 | 700 | $Co^{6,8}$ | | 2.32 | 4.17 | 6.16 | 8.91 |
| C4 | 430 | $W^{2,7}$ | | 3.90 | 10.48 | 18.54 | 37.67 |
| C5 | 430 | $W^{2,10}$ | | 3.88 | 8.80 | 14.24 | 23.17 |
| C6 | 430 | $Mo^{3,7}$ | | 3.75 | 9.69 | 16.73 | 34.28 |
| C7 | 420 | $Co^{5,7}$ | | 4.13 | 10.03 | 15.73 | 27.17 |

$^1$60 KeV, $^2$50 KeV, $^3$45 KeV, $^4$22 KeV, $^5$15 KeV, $^6$12 KeV, $^7$1E14/cm$^2$, $^8$5E12/cm$^2$, $^9$2E13/cm$^2$, $^{10}$2E12/cm$^2$

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes that come within the meaning and range of equivalency of the claims are to be embraced within their scope.

What is claimed and desired to be secured by United States Letters Patent is:

1. A method for agglomeration control at an interface of a refractory metal silicide layer and a silicon layer, comprising:
   bombarding a silicon layer over a semiconductor wafer with a first ion source to implant ions as a first diffusion barrier matrix at a predetermined depth within said silicon layer;
   bombarding said silicon layer with a second ion source to implant ions as a second diffusion barrier matrix at the surface of said silicon layer;
   depositing a metallization layer comprising a refractory metal above and on said silicon layer; and
   heat treating said silicon layer and said metallization layer to react said metallization layer with said silicon layer so as to form a refractory metal silicide layer, said refractory metal silicide layer extending to said predetermined depth within said silicon layer so as to interface with said first diffusion barrier matrix.

2. The method as defined in claim 1, further comprising removing said refractory metal from said metallization layer that is unreacted with said silicon layer.

3. The method as defined in claim 1, wherein said silicon layer is selected from the group consisting of monocrystalline silicon, amorphous silicon, and polysilicon.

4. The method as defined in claim 1, wherein said silicon layer comprises a material that is selected from the group consisting of monocrystalline silicon, amorphous silicon, and polysilicon, and said silicon layer is above and on an insulator layer.

5. The method as defined in claim 1, wherein said silicon layer comprises a material that is selected from the group consisting of monocrystalline silicon, amorphous silicon, and polysilicon, and said silicon layer is above and on a silicon substrate.

6. The method as defined in claim 1, wherein said silicon layer is a silicon substrate of said semiconductor wafer.

7. The method as defined in claim 3, further comprising forming said silicon layer at a temperature in a range of about 50° C. to about 900° C. by use of techniques selected from the group consisting of LPCVD, PECVD, APCVD, and sputtering.

8. The method as defined in claim 1, wherein said metallization layer is selected from the group consisting of Ti, W, Co, and Mo and combinations thereof.

9. The method as defined in claim 1, wherein said first and second diffusion barrier matrices consist of elements selected from the group consisting of P, N, Co, W, and Mo and combinations thereof.

10. The method as defined in claim 1, wherein said first diffusion barrier matrix comprises phosphorus ions implanted at an energy of about 60 keV at a concentration of about $2 \times 10^{13}/cm^2$, and said second barrier matrix comprises nitrogen ions implanted at an energy of about 12 keV at a concentration of about $2 \times 10^{13}/cm^2$.

11. The method as defined in claim 1, wherein heat treating said silicon layer and said metallization layer to react said metallization layer with said silicon layer so as to form a refractory metal silicide layer comprises rapid thermal processing.

12. The method as defined in claim 11, wherein said rapid thermal processing comprises multiple heat treatments by rapid thermal processing.

13. The method as defined in claim 12, wherein said multiple heat treatments by rapid thermal processing are conducted at about 1000° C. for about twenty seconds in an atmosphere of nitrogen.

14. A method according to claim 1, wherein depositing said metallization layer comprises physical vapor deposition of titanium at a temperature in a range from about 100° C. to about 300° C.

15. A method for fabricating a polysilicon gate MOS transistor structure, comprising:
   forming a device separation field oxide film on a portion of a silicon substrate of a semiconductor wafer using a field oxidation process;
   forming on said silicon substrate an insulating film and a silicon film above and on said insulating film;
   patterning said insulating film and said silicon film to form a gate insulating film and a gate above and on said gate insulating film, and to expose a portion of said silicon substrate;
   forming an insulating side wall spacer on lateral sides of said gate insulating film and said gate, and in contact with said silicon substrate;
   implanting a first diffusion barrier matrix with a first ion source within said gate at a predetermined depth;
   implanting a second diffusion barrier matrix with a second ion source at the surface of said gate;
   depositing a refractory metal film on said silicon substrate and said gate;
   applying a heat treatment process to said semiconductor wafer sufficient to form a refractory metal silicide film that extends down to an interface with said first diffusion barrier matrix and also extends laterally upon said silicon substrate between said side wall spacer and said device separation field oxide film; and
   removing substantially all of said refractory metal film on said silicon substrate and said gate that is unconverted to a refractory metal silicide film, whereby said second diffusion barrier matrix is separated from said first diffusion barrier matrix and is situated below a top surface of said refractory metal silicide film.

16. The method as defined in claim 15, wherein applying said heat treatment process to said semiconductor wafer comprises multiple heat treatments by rapid thermal processing.

17. The method as defined in claim 16, wherein said multiple heat treatments by rapid thermal processing are conducted at about 1000° C. for about twenty seconds in an atmosphere of nitrogen.

18. The method of claim 15, wherein said silicon film is a single layer of polycrystalline silicon film.

19. The method of claim 15, wherein said second ion source for implanting said second diffusion barrier matrix comprises nitrogen.

20. The method of claim 15, wherein said first ion source for implanting said first diffusion barrier matrix comprises phosphorus.

21. The method according to claim 15, wherein, said field oxide film has a thickness in a range from about 1,000 Å to about 3,000 Å, said insulating film has a thickness in a range from about 50 Å to about 150 Å, said silicon film has a thickness in a range from about 1,000 Å to about 2,000 Å, said predetermined depth is in a range from about 200 Å to about 1,000 Å, and said metal silicide film has a thickness in a range from about 500 Å to about 2,000 Å.

22. The method according to claim 15, wherein said first ion source and said second ion source consist of elements selected from the group consisting of P, N, Co, W, and Me and combinations thereof.

23. A method for fabricating a polysilicon gate MOS transistor structure, comprising:

forming a device separation field oxide film on a portion of a silicon substrate of a semiconductor wafer using a field oxidation process;

forming on said silicon substrate an insulating film and a silicon film above and on said insulating film;

implanting a first diffusion barrier matrix with a first ion source within said silicon film at a predetermined depth;

implanting a second diffusion barrier matrix with a second ion source at the surface of said silicon film;

patterning said insulating film and said silicon film to form a gate insulating film and a gate above and on said gate insulating film, and to expose a portion of said silicon substrate;

forming an insulating side wall spacer on lateral sides of said gate insulating film and said gate, and in contact with said silicon substrate;

depositing a refractory metal film on said silicon substrate and said gate;

applying a heat treatment process to said semiconductor wafer sufficient to form a refractory metal silicide film that extends down to an interface with said first diffusion barrier matrix and also extends laterally upon said silicon substrate between said side wall spacer and said device separation field oxide film; and removing substantially all of said refractory metal film on said silicon substrate and said gate that is unconverted to a refractory metal silicide film, whereby said second diffusion barrier matrix is separated from said first diffusion barrier matrix and is situated below a top surface of said refractory metal silicide film.

24. The method as defined in claim 23, wherein applying said heat treatment process to said semiconductor wafer comprises multiple heat treatments by rapid thermal processing.

25. The method as defined in claim 24, wherein said multiple heat treatments by rapid thermal processing are conducted at about 1000° C. for about twenty seconds in an atmosphere of nitrogen.

26. The method of claim 23 wherein said silicon film is a single layer of polycrystalline silicon film.

27. The method of claim 23, wherein said second ion source for implanting said second diffusion barrier matrix comprises nitrogen.

28. The method of claim 23, wherein said first ion source for implanting said first diffusion barrier matrix comprises phosphorus ions.

29. A method according to claim 23, wherein, said field oxide film has a thickness in a range from about 1,000 Å to about 3,000 Å, said insulating film has a thickness in a range from about 50 Å to about 150 Å, said silicon film has a thickness in a range from about 1,000 Å to about 2,000 Å, said predetermined depth is in a range from about 200 Å to about 1,000 Å, and said metal silicide film has a thickness in a range from about 500 Å to about 2,000 Å.

30. A method according to claim 23, wherein said first ion source and said second ion source consist of elements selected from the group consisting of P, N, Co, W, and Mo, and combinations thereof.

31. A method for forming a semiconductor device structure over a silicon substrate, said method comprising:

providing said silicon substrate;

forming a gate oxide layer over said silicon substrate, said gate oxide layer having a thickness in a range from about 50 Å to about 150 Å;

forming a silicon layer on said gate oxide layer, said silicon layer comprising a material selected from the group consisting of monocrystalline silicon, amorphous silicon, and polysilicon, said silicon layer having a thickness in a range from about 1,000 Å to about 2,000 Å;

implanting first ions into said silicon layer at a predetermined depth so as to form a first diffusion barrier matrix in said silicon layer, said first ions being selected from the group consisting of phosphorus ions, nitrogen ions, molybdenum ions, tungsten ions and cobalt ions, said predetermined depth being in a range from about 200 Å to about 1,000 Å;

patterning both of said gate oxide layer and said silicon layer to form therefrom a gate structure over said silicon substrate;

implanting second ions at the surface of said silicon layer so as to form a second diffusion barrier matrix in said silicon layer, said second ions being selected from the group consisting of phosphorus ions, nitrogen ions, molybdenum ions, tungsten ions and cobalt ions; and forming a metallization layer over said gate structure and on said silicon layer, said metallization layer comprising a refractory metal material selected from the group consisting of titanium, tungsten, cobalt, molybdenum, and combinations thereof.

32. A method according to claim 31, further comprising, prior to forming said gate oxide layer, forming a field oxide region in said silicon substrate, said field oxide region having a thickness in a range from about 1,000 Å to about 3,000 Å.

33. A method according to claim 31, further comprising, after forming said metallization layer, conducting a first anneal whereby a portion of said refractory metal material reacts with a portion of said silicon layer to form refractory metal silicide.

34. A method according to claim 33, further comprising, after conducting said first anneal, removing said refractory metal material from said metallization layer, wherein substantially all of the portion of said refractory metal material that has not reacted with said silicon layer is removed.

35. A method according to claim 34, further comprising conducting a second anneal after removing said refractory metal material from said metallization layer, said first anneal and said second anneal being conducted such that a refractory metal silicide layer is formed on said gate structure extending approximately to said first diffusion barrier matrix.

36. A method according to claim 35, wherein said refractory metal silicide layer has a thickness in a range from 500 Å to about 2,000 Å.

* * * * *

UNITED STATES PATENT AND TRADEMARK OFFICE
CERTIFICATE OF CORRECTION

PATENT NO. : 5,739,064
DATED : Apr. 14, 1998
INVENTOR(S) : Yong-Jun; Pai Hung Pan; Mark Klare It is certified that error appears in the above-identified patent and that said Letters Patent is hereby corrected as shown below:

Col. 3, line 3, after "as" insert --it--

Col. 3, line 21, after "significantly" change "reduce" to --reduces--

Col. 3, line 21, after "and" change "increase" to --increases--

Col. 7, line 28, after "and" change "Mc" to --Mo--

Signed and Sealed this

Twenty-eighth Day of September, 1999

Attest:

Q. TODD DICKINSON

*Attesting Officer*  *Acting Commissioner of Patents and Trademarks*